(12) United States Patent
Lecloux et al.

(10) Patent No.: US 8,716,700 B2
(45) Date of Patent: May 6, 2014

(54) ORGANIC LIGHT-EMITTING DIODES HAVING WHITE LIGHT EMISSION

(75) Inventors: Daniel David Lecloux, Wilmington, DE (US); Norman Herron, Newark, DE (US); Vsevolod Rostovtsev, Swarthmore, PA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 89 days.

(21) Appl. No.: 12/911,217

(22) Filed: Oct. 25, 2010

(65) Prior Publication Data

US 2011/0260144 A1 Oct. 27, 2011

Related U.S. Application Data

(60) Provisional application No. 61/362,052, filed on Jul. 7, 2010, provisional application No. 61/255,975, filed on Oct. 29, 2009.

(51) Int. Cl.
*H01L 29/08* (2006.01)

(52) U.S. Cl.
USPC .......................................................... 257/40

(58) Field of Classification Search
USPC .......................................................... 257/40
See application file for complete search history.

(56) References Cited

U.S. PATENT DOCUMENTS

| | | | | |
|---|---|---|---|---|
| 5,405,709 A | * | 4/1995 | Littman et al. | 428/690 |
| 5,503,910 A | * | 4/1996 | Matsuura et al. | 428/212 |
| 5,552,547 A | * | 9/1996 | Shi | 546/7 |
| 5,683,823 A | * | 11/1997 | Shi et al. | 428/690 |
| 5,904,994 A | * | 5/1999 | Dodabalapur et al. | 428/690 |
| 6,303,238 B1 | | 10/2001 | Thompson et al. | |
| 6,670,645 B2 | | 12/2003 | Grushin et al. | |
| 6,841,266 B2 | * | 1/2005 | Chen et al. | 428/690 |
| 6,885,026 B1 | * | 4/2005 | Helber et al. | 257/40 |
| 6,921,589 B2 | | 7/2005 | Kohama et al. | |
| 7,033,681 B2 | * | 4/2006 | Conley | 428/690 |
| 7,075,102 B2 | | 7/2006 | Grushin et al. | |
| 7,147,935 B2 | | 12/2006 | Kamatani et al. | |
| 7,250,512 B2 | | 7/2007 | Lecloux et al. | |
| 7,321,193 B2 | * | 1/2008 | Antoniadis et al. | 313/501 |
| 7,326,371 B2 | * | 2/2008 | Conley et al. | 252/583 |
| 7,329,984 B2 | | 2/2008 | Nagara et al. | |

(Continued)

FOREIGN PATENT DOCUMENTS

| EP | 0786925 A2 | 7/1997 |
|---|---|---|
| EP | 1343206 A2 | 9/2003 |

(Continued)

OTHER PUBLICATIONS

International Search Report, Korean Intellectual Property Office, International application No. PCT/US2010/054613, mailed May 31, 2011.

(Continued)

*Primary Examiner* — Kimberly Rizkallah
*Assistant Examiner* — Caleb Henry

(57) ABSTRACT

There is provided an organic light-emitting diode luminaire. The luminaire includes a first electrode, a second electrode, and an electroluminescent layer therebetween. The electroluminescent layer includes:
  a host material capable of electroluminescence having an emission color that is blue-green; and
  an electroluminescent dopant having an emission color that is red/red-orange.
The additive mixing of the emitted colors results in an overall emission of white light.

5 Claims, 2 Drawing Sheets

(56) References Cited

U.S. PATENT DOCUMENTS

| | | | |
|---|---|---|---|
| 7,362,796 B2 | 4/2008 | Shigeno | |
| 7,407,716 B2* | 8/2008 | Patwardhan et al. | 428/690 |
| 7,420,323 B2* | 9/2008 | Krummacher | 313/502 |
| 7,425,653 B2* | 9/2008 | Funahashi | 564/434 |
| 7,438,980 B2 | 10/2008 | Yeh et al. | |
| 7,452,613 B2* | 11/2008 | Poplavskyy et al. | 428/690 |
| 7,466,073 B2* | 12/2008 | Kishino et al. | 313/504 |
| 7,494,721 B2* | 2/2009 | Ikeda et al. | 428/690 |
| 7,501,189 B2* | 3/2009 | Tokailin et al. | 428/690 |
| 7,585,574 B2 | 9/2009 | Ito et al. | |
| 7,598,667 B2 | 10/2009 | Kawamura et al. | |
| 7,663,140 B2 | 2/2010 | Yamazaki et al. | |
| 7,679,282 B2* | 3/2010 | Choong et al. | 313/504 |
| 7,767,317 B2* | 8/2010 | Begley et al. | 428/690 |
| 7,794,858 B2 | 9/2010 | Park et al. | |
| 7,803,469 B2* | 9/2010 | Lee et al. | 428/690 |
| 7,811,677 B2* | 10/2010 | Ohsawa et al. | 428/690 |
| 7,816,859 B2* | 10/2010 | Spindler et al. | 313/504 |
| 7,834,214 B2* | 11/2010 | Funahashi | 564/429 |
| 7,834,546 B2* | 11/2010 | Krummacher et al. | 313/506 |
| 7,863,812 B2* | 1/2011 | Hung | 313/504 |
| 7,867,630 B2 | 1/2011 | Kim et al. | |
| 7,910,687 B2 | 3/2011 | Büsing et al. | |
| 8,080,277 B2 | 12/2011 | Takashima et al. | |
| 8,136,911 B2 | 3/2012 | Takashima et al. | |
| 8,154,195 B2 | 4/2012 | Nishimura et al. | |
| 8,158,835 B2 | 4/2012 | Kamatani et al. | |
| 8,188,474 B2 | 5/2012 | Hatano et al. | |
| 8,330,350 B2 | 12/2012 | Nishimura et al. | |
| 8,367,222 B2 | 2/2013 | Arakane et al. | |
| 8,502,202 B2* | 8/2013 | Nowatari et al. | 257/40 |
| 2003/0081431 A1 | 5/2003 | Brunfeld | |
| 2003/0096138 A1 | 5/2003 | Lecloux et al. | |
| 2003/0124381 A1 | 7/2003 | Thompson et al. | |
| 2003/0173896 A1* | 9/2003 | Grushin et al. | 313/506 |
| 2004/0033388 A1 | 2/2004 | Kim et al. | |
| 2004/0102577 A1 | 5/2004 | Hsu et al. | |
| 2004/0127637 A1 | 7/2004 | Hsu et al. | |
| 2005/0037233 A1 | 2/2005 | Dobbs et al. | |
| 2005/0100760 A1 | 5/2005 | Yokoyama | |
| 2005/0164033 A1 | 7/2005 | Chin et al. | |
| 2005/0184287 A1 | 8/2005 | Herron et al. | |
| 2005/0186447 A1* | 8/2005 | Grushin et al. | 428/690 |
| 2005/0205860 A1 | 9/2005 | Hsu et al. | |
| 2006/0066225 A1 | 3/2006 | Kishino et al. | |
| 2006/0105198 A1* | 5/2006 | Spindler et al. | 428/690 |
| 2006/0115676 A1 | 6/2006 | Igawa et al. | |
| 2006/0152146 A1* | 7/2006 | Funahashi | 313/504 |
| 2006/0159956 A1 | 7/2006 | Ito et al. | |
| 2006/0220011 A1 | 10/2006 | Kitamura et al. | |
| 2006/0267001 A1 | 11/2006 | Hung | |
| 2006/0283546 A1 | 12/2006 | Tremel et al. | |
| 2007/0015006 A1 | 1/2007 | Lee et al. | |
| 2007/0099026 A1 | 5/2007 | Lee et al. | |
| 2007/0114523 A1 | 5/2007 | Oumi et al. | |
| 2007/0241667 A1* | 10/2007 | Ohsawa et al. | 313/504 |
| 2007/0292718 A1* | 12/2007 | Lecloux et al. | 428/691 |
| 2008/0004445 A1* | 1/2008 | Hosokawa et al. | 546/171 |
| 2008/0093989 A1* | 4/2008 | Spindler et al. | 313/504 |
| 2008/0124571 A1 | 5/2008 | Ito et al. | |
| 2008/0160347 A1* | 7/2008 | Wang et al. | 428/704 |
| 2008/0193796 A1 | 8/2008 | Arakane et al. | |
| 2008/0213624 A1 | 9/2008 | Lecloux et al. | |
| 2008/0286605 A1 | 11/2008 | Takeda | |
| 2008/0303425 A1 | 12/2008 | Rostovtsev et al. | |
| 2008/0306303 A1 | 12/2008 | Rostovtsev et al. | |
| 2009/0039776 A1 | 2/2009 | Yamada et al. | |
| 2009/0053488 A1* | 2/2009 | Jinde et al. | 428/213 |
| 2009/0085468 A1* | 4/2009 | Funahashi et al. | 313/504 |
| 2009/0162693 A1 | 6/2009 | Ionkin | |
| 2009/0174308 A1 | 7/2009 | Yamazaki et al. | |
| 2009/0200919 A1 | 8/2009 | Kamatani et al. | |
| 2010/0219400 A1* | 9/2010 | Arakane et al. | 257/40 |
| 2010/0295032 A1* | 11/2010 | Kwong et al. | 257/40 |
| 2011/0024732 A1* | 2/2011 | Ohsawa et al. | 257/40 |
| 2011/0101316 A1 | 5/2011 | Lecloux et al. | |
| 2013/0084548 A1 | 4/2013 | Caverly | |

FOREIGN PATENT DOCUMENTS

| | | |
|---|---|---|
| EP | 1905809 A2 | 4/2008 |
| EP | 2086032 A2 | 8/2009 |
| JP | 10161567 A | 6/1998 |
| JP | 2003092002 A | 3/2003 |
| JP | 2005203364 A | 7/2005 |
| JP | 2006019022 A | 1/2006 |
| JP | 2006040856 A | 2/2006 |
| JP | 2006063233 A | 3/2006 |
| JP | 2006269253 A | 10/2006 |
| JP | 2008078014 A | 4/2008 |
| JP | 2008085363 A | 4/2008 |
| JP | 2009048829 A | 3/2009 |
| KR | 1020050074208 A | 7/2005 |
| KR | 1020070113435 A | 11/2007 |
| KR | 100796615 B1 | 1/2008 |
| KR | 100882911 B1 | 2/2009 |
| KR | 1020090059488 A | 6/2009 |
| KR | 100920533 B1 | 10/2009 |
| WO | 0070655 A2 | 11/2000 |
| WO | 0141512 A1 | 6/2001 |
| WO | 03008424 A1 | 1/2003 |
| WO | 03040257 A1 | 5/2003 |
| WO | 03063555 A1 | 7/2003 |
| WO | 03091688 A2 | 11/2003 |
| WO | 2004016710 A1 | 2/2004 |
| WO | 2005052027 A1 | 6/2005 |
| WO | 2006-025512 A1 | 3/2006 |
| WO | 2006094101 A1 | 9/2006 |
| WO | 2009-018009 | 2/2009 |
| WO | 2009018009 A1 | 2/2009 |

OTHER PUBLICATIONS

CRC Handbook of Chemistry and Physics 81$^{st}$ Edition, 2000 (Book Not Included).
Gustafsson et al., Nature, Flexible Light Emitting Diodes Made From Soluble Conducting Polymers, 1992, V357, pp. 477-479.
Y. Wang, Kirk-Othmer Encyclopedia of Chemical Technology, Fourth Edition, vol. 18, pp. 837-860, 1996 (Book Not Included).
Ge et al., "Solution Processable Bipolar Triphenylamine Benzimidazole Derivatives for Highly Efficient Single Layer Organic Light Emitting Diodes," Chemistry of Materials, 2008, vol. 20, pp. 2532-2537.
Shih et al., "Novel Carbazole/Fluorene Hybrids: Host Materials for Blue Phosphorescent OLEDs," Organic Letters, 2006, vol. 8, pp. 2799-2802.
International Search Report for Application No. PCT/US2010/054394; Ju Seung Kim, Authorized Officer; Korean Intellectual Property Office; Jun. 20, 2011.
International Search Report for Application No. PCT/US2010/059789; Kim, Je Seung, Authorized Officer; KIPO; May 31, 2011.
International Search Report for Application No. PCT/US2010/046306; Kim, Je Seung, Authorized Officer; KIPO; Mar. 25, 2011.
International Search Report for Application No. PCT/US2010/054713; Kim, Ju Seung, Authorized Examiner; KIPO; Jun. 20, 2011.
International Search Report for Application No. PCT/US2010/054683; Kim, Ju Seung, Authorized Examiner; KIPO; Jun. 20, 2011.
International Search Report for Application No. PCT/US2010/054607, counterpart to U.S. Appl. No. 12/911,241; Kim Ju Seung, Authorized Officer; KIPO; May 31, 2011.
Extended European Search Report for Application No. 10830433.8, counterpart to U.S. Appl. No. 12/911,043; Sep. 27, 2013.
Extended European Search Report for Application No. 10830483.3, counterpart to U.S. Appl. No. 12/911,217; Oct. 9, 2013.
Extended European Search Report for Application No. 10830495.7, counterpart to U.S. Appl. No. 12/911,203; Oct. 11, 2013.

* cited by examiner

ORGANIC LIGHT-EMITTING DIODES HAVING WHITE LIGHT EMISSION

RELATED APPLICATION DATA

This application claims priority under 35 U.S.C. §119(e) from U.S. Provisional Application Nos. 61/255,975 filed on Oct. 29, 2009 and 61/362,052 filed on Jul. 7, 2010 which is incorporated by reference herein in its entirety.

BACKGROUND INFORMATION

1. Field of the Disclosure

This disclosure relates in general to organic light-emitting diode ("OLED") luminaries. It also relates to a process for making such devices.

2. Description of the Related Art

Organic electronic devices that emit light are present in many different kinds of electronic equipment. In all such devices, an organic active layer is sandwiched between two electrodes. At least one of the electrodes is light-transmitting so that light can pass through the electrode. The organic active layer emits light through the light-transmitting electrode upon application of electricity across the electrodes. Additional electroactive layers may be present between the electroluminescent layer and the electrode(s).

It is well known to use organic electroluminescent compounds as the active component in light-emitting diodes. Simple organic molecules, such as anthracene, thiadiazole derivatives, and coumarin derivatives are known to show electroluminescence. In some cases these small molecule materials are present as a dopant in a host material to improve processing and/or electronic properties. OLEDs emitting white light can be used for lighting applications.

There is a continuing need for new OLED structures and processes for making them for lighting applications.

SUMMARY

There is provided an organic light-emitting diode luminaire comprising a first electrode, a second electrode, and an electroluminescent layer therebetween, the electroluminescent layer comprising:
a host material capable of electroluminescence having an emission color that is blue-green; and
an electroluminescent dopant having an emission color that is red/red-orange;
wherein the additive mixing of the two emitted colors results in an overall emission of white light.

There is also provided a process for making an OLED luminaire, comprising:
providing a substrate having a first electrode thereon;
depositing a liquid composition comprising a liquid medium having dispersed therein a host material capable of electroluminescence having an emission color that is blue-green and an electroluminescent dopant having an emission color that is red/red-orange;
drying the deposited composition to form an electroluminescent layer; and
forming a second electrode overall.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1B:
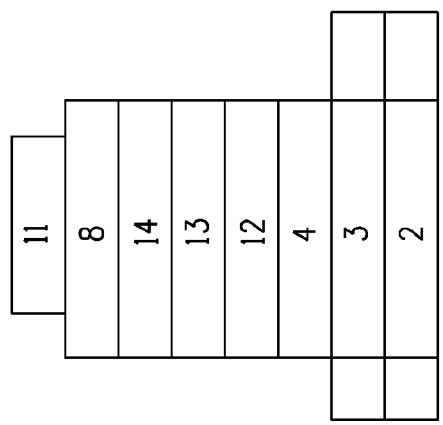
FIG. 1(b) is an illustration of another prior art white light-emitting device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Luminaire, Materials, the Process and finally Examples.

1. Definitions and Clarification of Terms

Before addressing details of embodiments described below, some terms are defined or clarified.

As used herein, the term "alkoxy" refers to the group $R^O-$, where R is an alkyl.

The term "alkyl" is intended to mean a group derived from an aliphatic hydrocarbon having one point of attachment, and includes a linear, a branched, or a cyclic group. The term is intended to include heteroalkyls. The term "hydrocarbon alkyl" refers to an alkyl group having no heteroatoms. In some embodiments, an alkyl group has from 1-20 carbon atoms.

The term "aryl" is intended to mean a group derived from an aromatic hydrocarbon having one point of attachment. The term "aromatic compound" is intended to mean an organic compound comprising at least one unsaturated cyclic group having delocalized pi electrons. The term is intended include heteroaryls. The term "hydrocarbon aryl" is intended to mean aromatic compounds having no heteroatoms in the ring. In some embodiments, an aryl group has from 3-30 carbon atoms.

The term "blue-green" refers to an emission with color coordinates of x=0.16-0.21 and y=0.47-0.63.

The term "color coordinates" refers to the x- and y-coordinates according to the C.I.E. chromaticity scale (Commission Internationale de L'Eclairage, 1931).

The term "CRI" refers to the CIE Color Rendering Index. It is a quantitative measure of the ability of a light source to reproduce the colors of various objects faithfully in comparison with an ideal or natural light source. A reference source, such as black body radiation, is defined as having a CRI of 100.

The term "dopant" is intended to mean a material, within a layer including a host material, that changes the wavelength(s) of radiation emission of the layer compared to the wavelength(s) of radiation emission of the layer in the absence of such material.

The term "drying" is intended to mean the removal of at least 50% by weight of the liquid medium; in some embodiments, at least 75% by weight of the liquid medium. A "partially dried" layer is one in which some liquid medium remains. A layer which is "essentially completely dried" is one which has been dried to an extent such that further drying does not result in any further weight loss.

The term "electroluminescence" refers to the emission of light from a material in response to an electric current passed through it. "Electroluminescent" refers to a material or layer that is capable of electroluminescence.

The prefix "fluoro" indicates that one or more available hydrogen atoms have been replaced with a fluorine atom.

The prefix "hetero" indicates that one or more carbon atoms have been replaced with a different atom. In some embodiments, the different atom is N, O, or S.

The term "host material" is intended to mean a material, usually in the form of a layer, to which an electroluminescent dopant may be added and from which the dopant will be emissive. The host material is present in higher concentration than the sum of all the dopant concentrations.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The term "liquid medium" is intended to mean a liquid material, including a pure liquid, a combination of liquids, a solution, a dispersion, a suspension, and an emulsion. Liquid medium is used regardless whether one or more solvents are present.

The term "luminaire" refers to a lighting panel, and may or may not include the associated housing and electrical connections to the power supply.

The term "overall emission" as it refers to a luminaire, means the perceived light output of the luminaire as a whole.

The term "red/red-orange" refers to an emission with color ranging from red to red-orange and having color coordinates of x=0.60-0.68 and y=0.28-0.38.

The term "silyl" refers to the group $R_3Si-$, where R is H, D, C1-20 alkyl, fluoroalkyl, or aryl. In some embodiments, one or more carbons in an R alkyl group are replaced with Si. In some embodiments, the silyl groups are $(hexyl)_2Si(CH_3)$ $CH_2CH_2Si(CH_3)_2-$ and $[CF_3(CF_2)_6CH_2]_2Si(CH_3)_2-$.

The term "white light" refers to light perceived by the human eye as having a white color.

All groups may be unsubstituted or substituted. In some embodiments, the substituents are selected from the group consisting of D, halide, alkyl, alkoxy, aryl, aryloxy, and fluoroalkyl.

Unless otherwise indicated, all groups can be unsubstituted or substituted. Unless otherwise indicated, all groups can be linear, branched or cyclic, where possible. In some embodiments, the substituents are selected from the group consisting of halide, alkyl, alkoxy, silyl, siloxane, aryl, and cyano.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics,* $81^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. The Luminaire

Figure 1A:
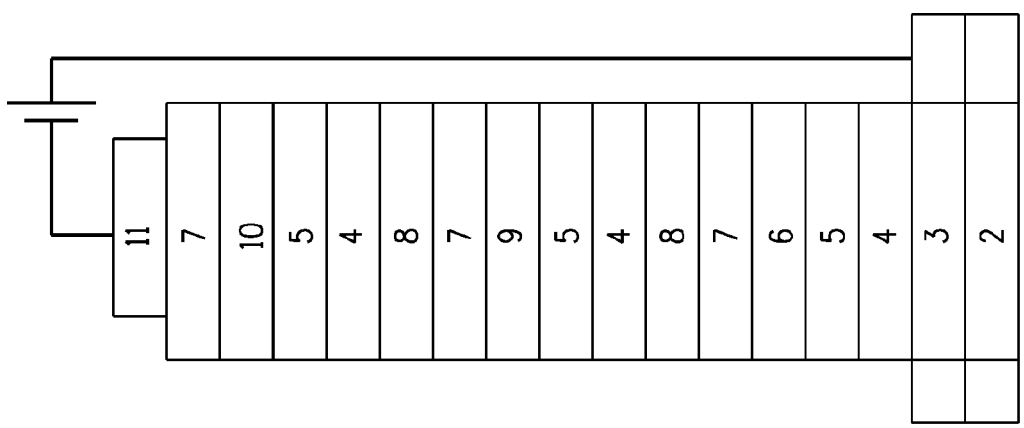
FIG. 1(a) is an illustration of one prior art white light-emitting device.

It is known to have white light-emitting layers in which emissive layers of different colors are stacked on top of each other between an anode and a cathode. Two exemplary prior art devices are shown in FIG. 1. In FIG. 1a, the anode 3 and the cathode 11 have a blue light-emitting layer 6, a green light-emitting layer 9, and a red light-emitting layer 10 stacked between them on substrate 2. On either side of the electroluminescent layers are hole transport layers 4, electron transport layers 8. there are also hole blocking layers 7 and electron blocking layers 5. In FIG. 1b, the substrate 2, anode 3, hole transport layer 4, electron transport layer 8 and cathode 11 are present as shown. Light-emitting layer 12 is a combination of yellow and red light-emitters in a host material. Light-emitting layer 13 is a blue light-emitting in a host material. Layer 14 is an additional layer of host material.

The luminaire described herein has a single light-emitting layer rather than multiple electroluminescent layers in a stacked configuration.

The luminaire has a first electrode, a second electrode, and an electroluminescent layer therebetween. The electroluminescent layer comprises a host material capable of electroluminescence having blue-green emission color and an electroluminescent dopant having red/red-orange emission color. The additive mixing of the emitted colors results in an overall emission of white light. At least one of the electrodes is at least partially transparent to allow for transmission of the generated light.

One of the electrodes is an anode, which is an electrode that is particularly efficient for injecting positive charge carriers. In some embodiments, the first electrode is an anode. In some embodiments, the anode is at least partially transparent.

The other electrode is a cathode, which is an electrode that is particularly efficient for injecting electrons or negative charge carriers. In some embodiments, the cathode is a continuous, overall layer.

The electroluminescent materials can be chosen based on high luminous efficiency instead, as long as high CRI values are obtainable.

In some embodiments, the OLED luminaire further comprises additional layers. In some embodiments, the OLED luminaire further comprises one or more charge transport layers. The term "charge transport," when referring to a layer, material, member, or structure is intended to mean such layer, material, member, or structure facilitates migration of such charge through the thickness of such layer, material, member, or structure with relative efficiency and small loss of charge. Hole transport layers facilitate the movement of positive charges; electron transport layers facilitate the movements of negative charges. Although electroluminescent materials may also have some charge transport properties, the term "charge transport layer, material, member, or structure" is not intended to include a layer, material, member, or structure whose primary function is light emission.

In some embodiments, the OLED luminaire further comprises one or more hole transport layers between the electroluminescent layer and the anode. In some embodiments, the OLED luminaire further comprises one or more electron transport layers between the electroluminescent layer and the cathode.

In some embodiments, the OLED luminaire further comprises a hole injection layer between the anode and a hole transport layer. The term "hole injection layer" or "hole injection material" is intended to mean electrically conductive or semiconductive materials. The hole injection layer may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device.

Figure 2:
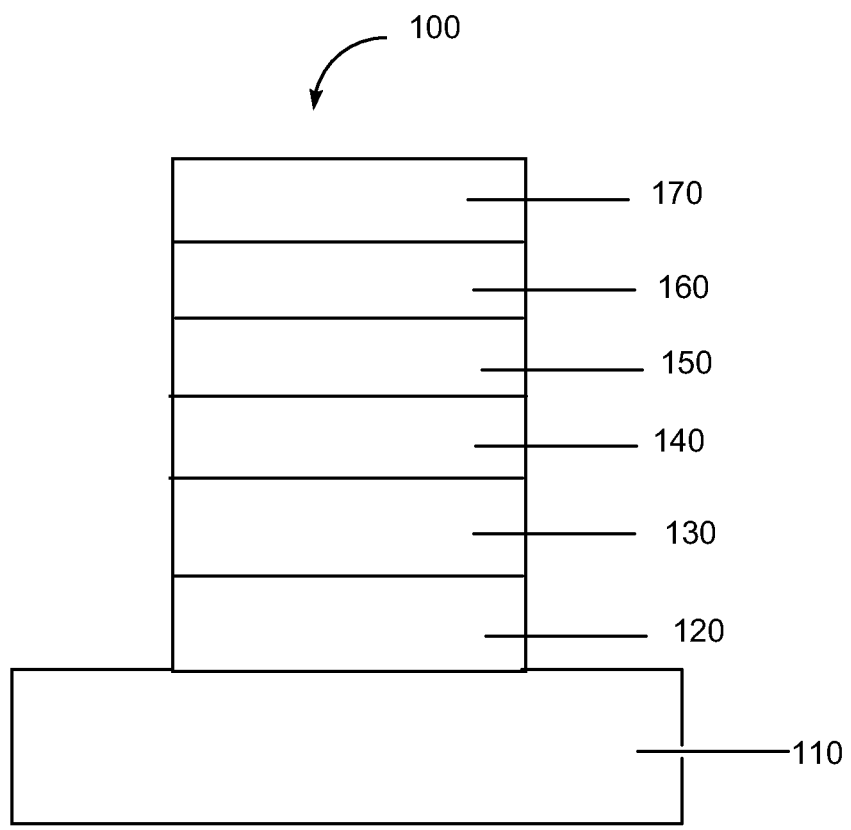
FIG. 2 is an illustration of an OLED luminaire.

One example of an OLED luminaire is illustrated in FIG. 2. OLED luminaire 100 has substrate 110 with anode 120. On the anode are the organic layers: hole injection layer 130, hole transport layer 140, and the electroluminescent layer 150. The electron transport layer 380 and cathode 390 are applied overall.

The OLED luminaire can additionally be encapsulated to prevent deterioration due to air and/or moisture. Various encapsulation techniques are known. In some embodiments, encapsulation of large area substrates is accomplished using a thin, moisture impermeable glass lid, incorporating a desiccating seal to eliminate moisture penetration from the edges of the package. Encapsulation techniques have been described in, for example, published US application 2006-0283546.

There can be different variations of OLED luminaries which differ only in the complexity of the drive electronics (the OLED panel itself is the same in all cases). The drive electronics designs can still be very simple.

3. Materials

The electroluminescent layer of the device comprises a host material capable of electroluminescence having an emission color that is blue-green and an electroluminescent dopant having an emission color that is red/red-orange. In some embodiments, the electroluminescent layer consists essentially of the host material and the dopant.

a. Host

The host of the present invention is an electroluminescent material having blue-green emission color. The host is selected so that emission can be achieved from the host and the two dopants. For example, the host should have a HOMO-LUMO gap that is greater than the gap for each of the two electroluminescent dopants. In addition, the triplet energy of the host should be high enough so that it does not quench the emission from the organometallic electroluminescent materials.

Any type of electroluminescent ("EL") material can be used as the host so long as it has the appropriate electronic properties. Types of EL host materials, include, but are not limited to, small molecule organic luminescent compounds, luminescent metal complexes, conjugated polymers, and mixtures thereof. In some embodiments, a combination of two or more electroluminescent materials having blue emission color are present as hosts.

In some embodiments, the host material capable of electroluminescence with blue-green emission color is an organometallic complex of Ir. In some embodiments, the organometallic Ir complex is a tris-cyclometallated complex having the formula $IrL_3$ or a bis-cyclometallated complex having the formula $IrL_2Y$, where Y is a monoanionic bidentate ligand and L has a formula selected from the group consisting of Formula L-1 through Formula L-17:

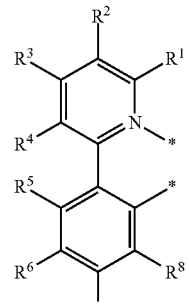

L-1

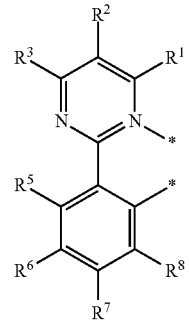

L-2

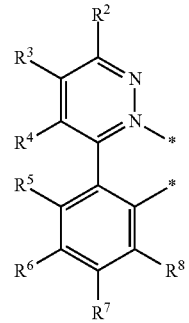

L-3

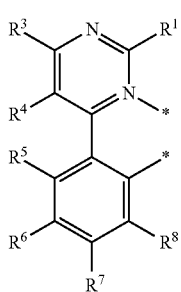
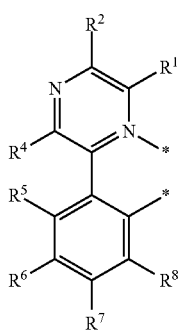
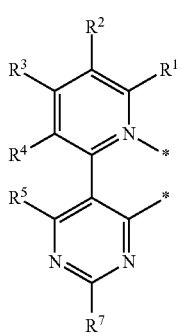
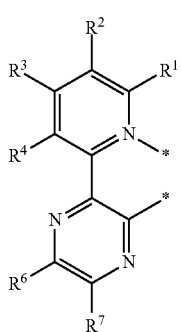
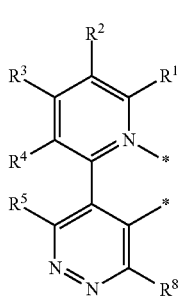
L-4
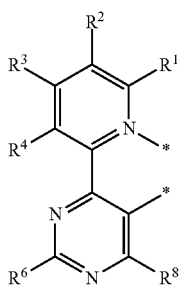
L-5
L-6
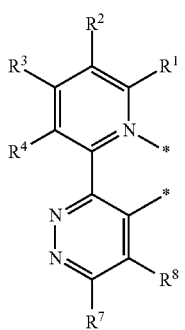
L-7
L-8
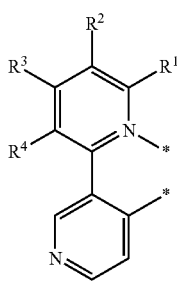
L-9
L-10
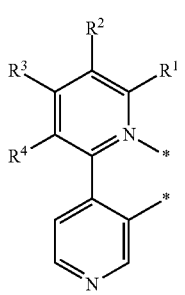
L-11
L-12
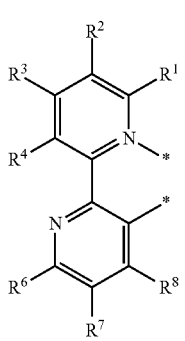
L-13

-continued

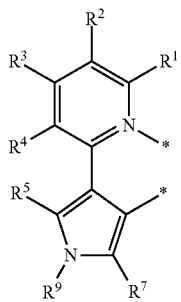

L-14

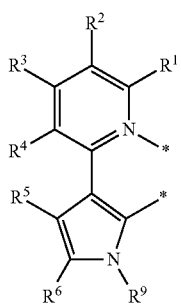

L-15

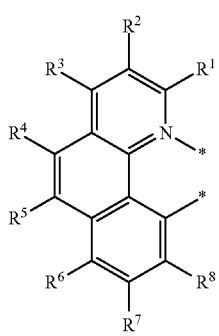

L-16

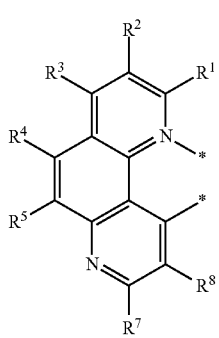

L-17 where
R$^1$ through R$^8$ are the same or different and are selected from the group consisting of H, D, electron-donating groups, and electron-withdrawing groups;
R$^9$ is H, D or alkyl; and
* represents a point of coordination with Ir.

The emitted color is tuned by the selection and combination of electron-donating and electron-withdrawing substituents. In addition, the color is tuned by the choice of Y ligand in the bis-cyclometallated complexes. Shifting the color to shorter wavelengths is accomplished by (a) selecting one or more electron-donating substituents for R$^1$ through R$^4$; and/or (b) selecting one or more electron-withdrawing substituents for R$^5$ through R$^8$; and/or (c) selecting a bis-cyclometallated complex with ligand Y-1, shown below. Conversely, shifting the color to longer wavelengths is accomplished by (a) selecting one or more electron-withdrawing substituents for R$^1$ through R$^4$; and/or (b) selecting one or more electron-donating substituents for R$^5$ through R$^8$; and/or (c) selecting a bis-cyclometallated complex with ligand Y-2, shown below. Examples of electron-donating substituents include, but are not limited to, alkyl, silyl, alkoxy and dialkylamino. Examples of electron-withdrawing substituents include, but are not limited to, F, fluoroalkyl, and fluoroalkoxy. Substituents may also be chosen to affect other properties of the materials, such as solubility, air and moisture stability, emissive lifetime, and others.

In some embodiments of Formulae L-1 through L-17, at least one of R$^1$ through R$^4$ is an electron-donating substituent. In some embodiments of Formula L-1, at least one of R$^5$ through R$^8$ is an electron-withdrawing substituent.

In some embodiments of Formulae L-1 through L-12:
R$^1$ is H, D, alkyl, or silyl;
R$^2$ is H, D, alkyl. or silyl;
R$^3$=H, D, F, OR$^{10}$, NR$^{10}{}_2$;
R$^4$=H, D, alkyl, or silyl;
R$^5$=H, D or F;
R$^6$=H, D, F, CN, alkyl, fluoroalkyl, alkoxy, fluoroalkoxy, aryl, or diaryloxophosphinyl;
R$^7$=H, D, F, alkyl, fluoroalkyl, alkoxy, fluoroalkoxy, aryl, or diaryloxophosphinyl;
R$^8$=H, D, CN, alkyl, fluoroalkyl;
R$^9$=H, D, alkyl, or silyl; and
R$^{10}$=alkyl, where adjacent R$^{10}$ groups can be joined to form a saturated ring.

In some embodiments, Y is selected from the group consisting of Y-1, Y-2 and Y-3

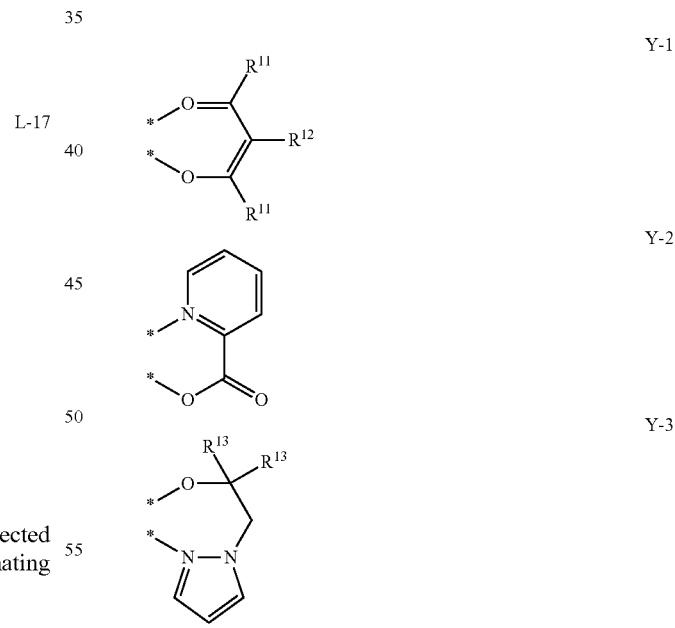

wherein:
R$^{11}$ is the same or different at each occurrence and is selected from the group consisting of alkyl and fluoroalkyl;
R$^{12}$ is H, D or F; and
R$^{13}$ is the same or different at each occurrence and is selected from the group consisting of alkyl and fluoroalkyl.

In some embodiments, the alkyl and fluoroalkyl groups have 1-5 carbon atoms. In some embodiments, the alkyl group is methyl. In some embodiments, the fluoroalkyl group is trifluoromethyl. In some embodiments, the aryl group is a heteroaryl. In some embodiments, the heteroaryl group has one or more nitrogen heteroatoms. In some embodiments, the aryl group is a phenyl group having one or more substituents selected from the group consisting of D, F, CN, CF$_3$, and aryl. In some embodiments, the aryl group is selected from the group consisting of o-fluorophenyl, m-fluorophenyl, p-fluorophenyl, p-cyanophenyl, and 3,5-bis(trifluoromethyl)phenyl. In some embodiments, the diaryloxophosphinyl group is diphenyloxophosphinyl.

In some embodiments, the organometallic Ir complex having blue-green emission color has the formula IrL$_3$. In some embodiments, the complex has the formula IrL$_3$, where L is Formula L-1, at least one of $R^5$, $R^6$, $R^7$ and $R^8$ is F, aryl, heteroaryl, or diaryloxophosphinyl.

In some embodiments, the organometallic Ir complex having blue-green emission color has the formula IrL$_2$Y. and L=L-6 or L-13. In some embodiments, all R are H or D.

Examples of organometallic Ir complexes having blue-green emission color include, but are not limited to:

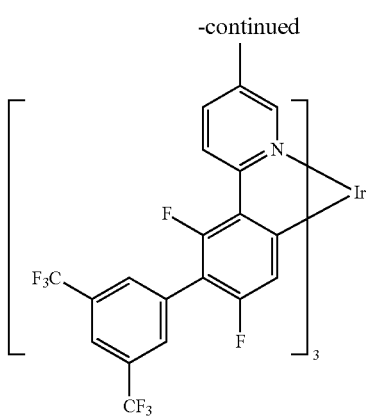

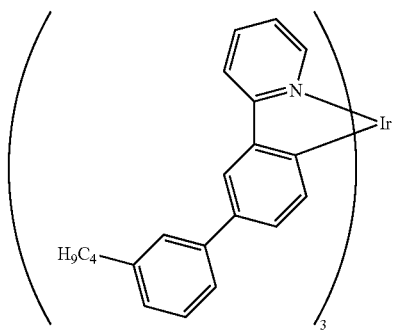

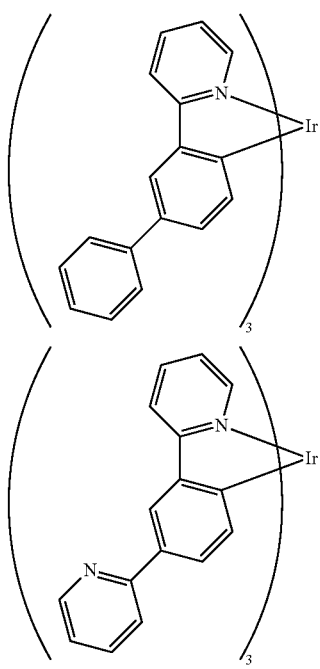

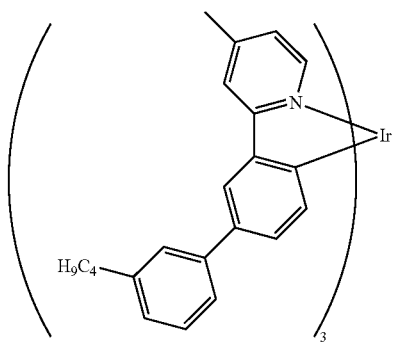

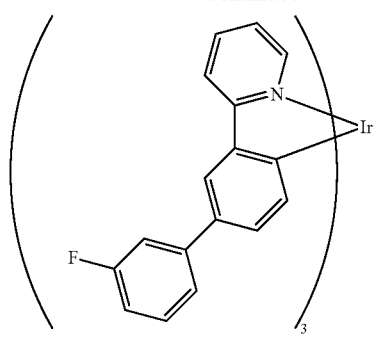
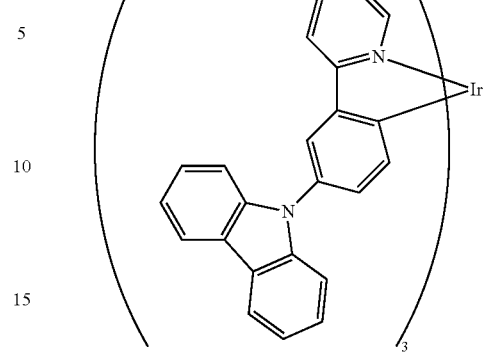
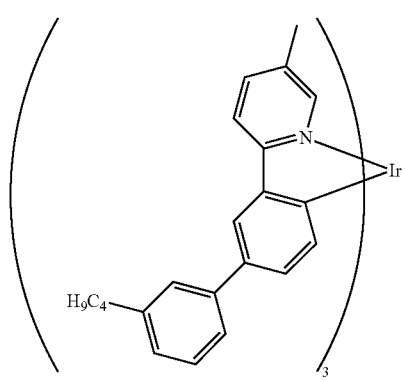
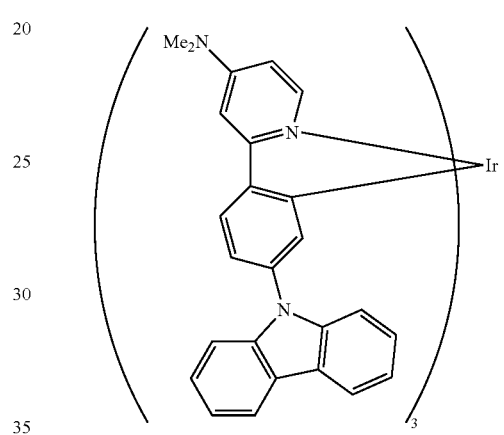
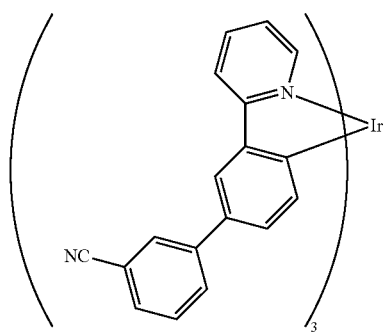
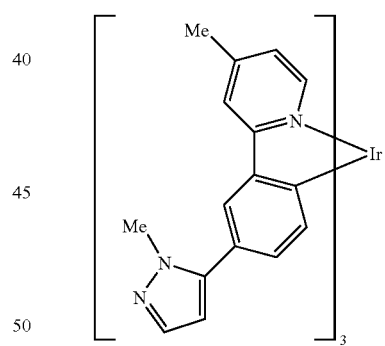
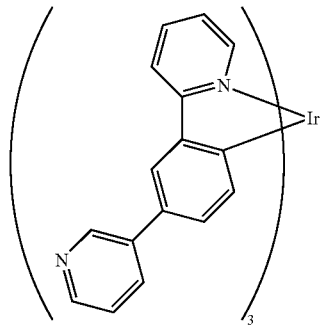
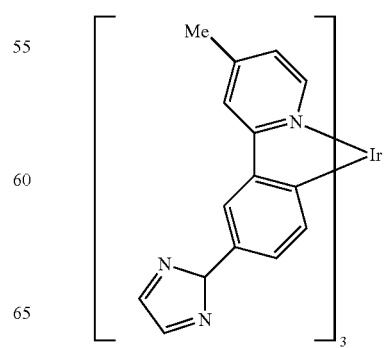

-continued
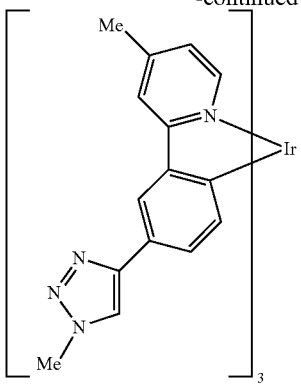
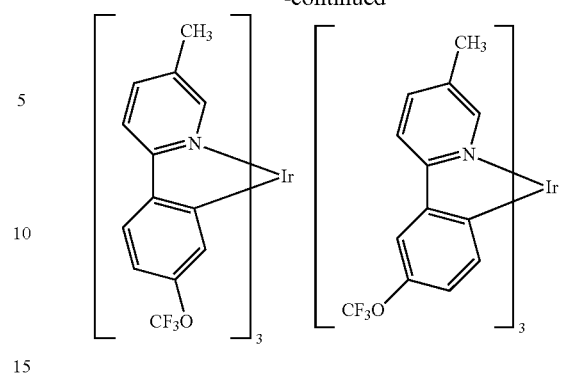
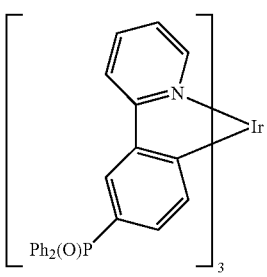
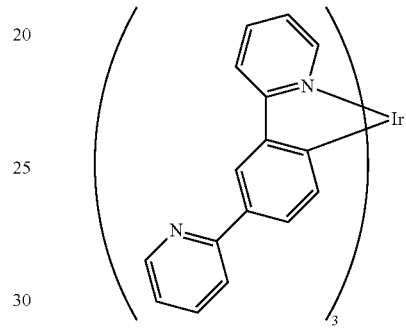
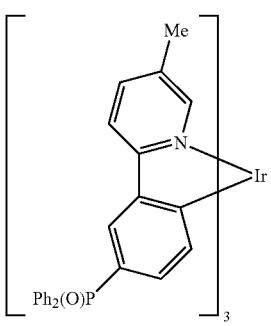
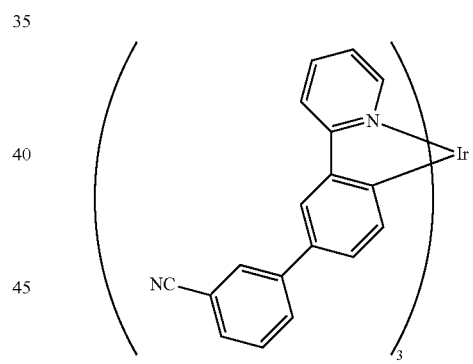
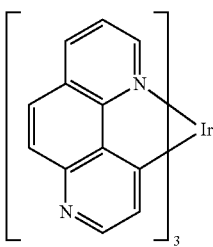
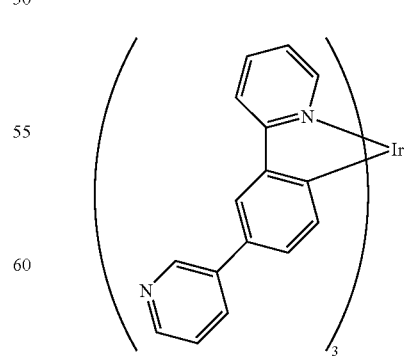
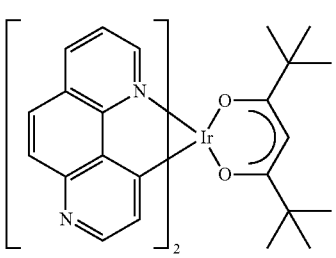
In some embodiments, the host having blue-green emission color is a small luminescent organic compound.

In some embodiments, the host is a chrysene derivative. In some embodiments, the chrysene derivative has Formula I

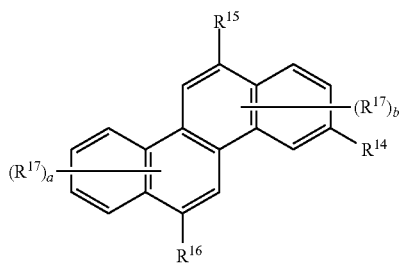

Formula I where:
R$^{14}$, R$^{15}$, m and R$^{16}$ are the same or different and are selected from the group consisting of H, D, alkyl, alkoxy, silyl, siloxane, and NAr$_2$, where at least one of R$^{14}$, R$^{15}$, and R$^{16}$ is NAr$_2$;
R$^{17}$ is the same or different at each occurrence and is selected from the group consisting of D, alkyl, alkoxy, silyl, and siloxane, or adjacent R$^{17}$ groups may be joined together to form a 5- or 6-membered aliphatic ring,
Ar is the same or different at each occurrence and is an aryl group;
a is an integer from 0 to 5; and
b is an integer from 0 to 4.

In some embodiments, the host is a chrysene derivative having Formula II:

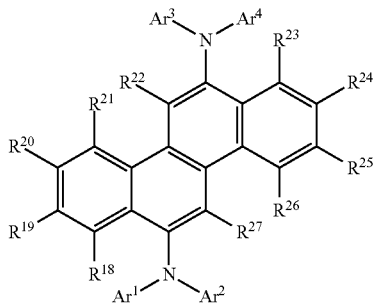

Formula II wherein:
Ar$^1$ and Ar$^3$ are the same or different and are aryl, and at least one of Ar$^1$ and Ar$^3$ has at least one alky substituent, with the proviso that there are no electron-withdrawing substituents;
Ar$^2$ and Ar$^4$ are the same or different and are aryl;
R$^{18}$, R$^{19}$, m and R$^{21}$ are the same or different and are selected from the group consisting of H, D, and an electron-withdrawing group;
R$^{20}$ is an electron-withdrawing group;
R$^{22}$ through R$^{27}$ are the same or different and are selected from the group consisting of H, D, and alkyl.
The compound is capable of blue-green emission.

In some embodiments, the electron-withdrawing group ("EWG") is selected from the group consisting of fluoro, perfluoroalkyl, cyano, nitro, —SO$_2$R, where R is alkyl or perfluoroalkyl, deuterated derivatives thereof, and combinations thereof. In some embodiments, the EWG is trifluoromethyl or cyano.

In some embodiments, both R$^{18}$ and R$^{20}$ are EWGs. In some embodiments, R$^{19}$ and R$^{22}$ through R$^{27}$ are H or D.

In some embodiments, Ar$^1$ through Ar$^4$ are independently selected from the group consisting of phenyl, biphenyl, naphthyl, binaphthyl, and deuterated derivatives thereof. In some embodiments, at least one of Ar$^1$ through Ar$^4$ is substituted with C1-20 alkyl or deuterated alkyl. In some embodiments, the alkyl is branched.

In some embodiments, Ar$^1$ and Ar$^3$ are phenyl groups or deuterated derivatives thereof. In some embodiments, the phenyl groups have 1-5 alkyl or deuterated alkyl substituents.

In some embodiments, at least one of Ar$^2$ and Ar$^4$ has at least one alkyl or deuterated alkyl substituent. In some embodiments, the alkyl group has 1-8 carbon atoms. In some embodiments, both Ar$^2$ and Ar$^4$ are selected from the group consisting of phenyl, biphenyl and deuterated derivatives thereof.

In some embodiments, Ar$^1$ and Ar$^3$ are phenyl groups having at least one alkyl or deuterated alkyl substituent and Ar$^2$ and Ar$^4$ are biphenyl groups having at least one alkyl or deuterated alkyl substituent. In some embodiments, Ar$^1$ and Ar$^3$ are deuterated phenyl groups having at least one alkyl or deuterated alkyl substituent and Ar$^2$ and Ar$^4$ are deuterated biphenyl groups having at least one alkyl or deuterated alkyl substituent.

The chrysene derivatives can be prepared by known coupling and substitution reactions.

Examples of chrysene compounds with blue-green emission color include, but are not limited to:

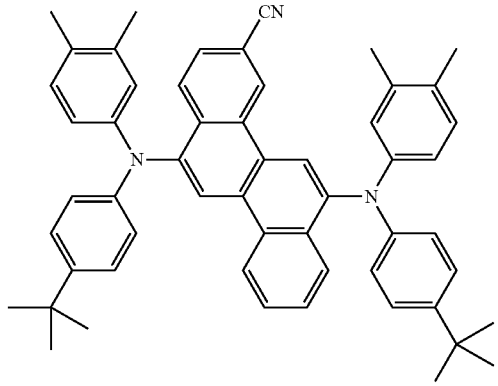 [SMILES: Cc1ccc(N(c2ccc(C(C)(C)C)cc2)c2cc3c4cc(C#N)ccc4c(N(c4ccc(C(C)(C)C)cc4)c4ccc(C)c(C)c4)cc3c3ccccc23)cc1C]

In some embodiments, the electroluminescent dopant with red/red-orange emission color is an organometallic complex of Ir. In some embodiments, the organometallic Ir complex is a tris-cyclometallated complex having the formula IrL$_3$ or a bis-cyclometallated complex having the formula IrL$_2$Y, where Y is a monoanionic bidentate ligand and L has a formula selected from the group consisting of Formula L-18, L-19, L-20, and L-21:

L-18

-continued

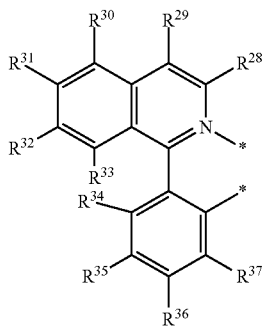

L-19

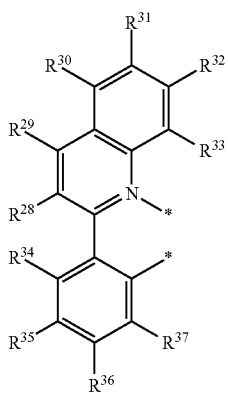

L-20

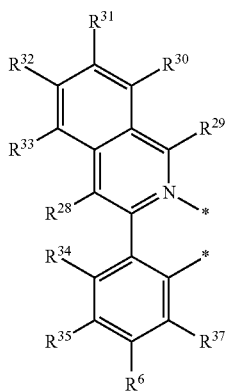

L-21 where:
R$^1$ through R$^6$ and R$^{28}$ through R$^{37}$ are the same or different and are selected from the group consisting of H, D, electron-donating groups, and electron-withdrawing groups; and
* represents a point of coordination with Ir.

As discussed above, the emitted color is tuned by the selection and combination of electron-donating and electron-withdrawing substituents, and by the selection of the Y ligand in the bis-cyclometallated complexes. Shifting the color to shorter wavelengths is accomplished by (a) selecting one or more electron-donating substituents for R$^1$ through R$^4$ or R$^{28}$ through R$^{33}$; and/or (b) selecting one or more electron-withdrawing substituents for R$^5$ through R$^6$ or R$^{34}$ through R$^{37}$; and/or (c) selecting a bis-cyclometallated complex with ligand Y-1. Conversely, shifting the color to longer wavelengths is accomplished by (a) selecting one or more electron-withdrawing substituents for R$^1$ through R$^4$ or R$^{28}$ through R$^{33}$; and/or (b) selecting one or more electron-donating substituents for R$^5$ through R$^6$ or R$^{34}$ through R$^{37}$; and/or (c) selecting a bis-cyclometallated complex with ligand Y-2.

In some embodiments of Formulae L-18 through L-20:
R$^1$ through R$^4$ and R$^{28}$ through R$^{33}$ are the same or different and are H, D, alkyl, alkoxy, or silyl; wherein ligand L-19 any one or more of (i) R$^1$ and R$^2$, (ii) R$^2$ and R$^3$, and (iii) R$^3$ and R$^4$ can be joined together to form a hydrocarbon ring or hetero ring; in ligand L-19 any one or more of (iv) R$^{30}$ and R$^{31}$ and (v) R$^{31}$ and R$^{32}$ can be joined together to form a hydrocarbon ring or hetero ring; in ligand L-20 any one or more of (vi) R$^{30}$ and R$^{31}$ and (vii) R$^{31}$ and R$^{32}$ can be joined together to form a hydrocarbon ring or hetero ring; in ligand L-21 any one or more of (viii) R$^{31}$ and R$^{31}$, (ix) R$^{31}$ and R$^{32}$, and (x) R$^{32}$ and R$^{33}$ can be joined together to form a hydrocarbon ring or hetero ring;
R$^{34}$=H, D, F, alkyl, silyl, or alkoxy;
R$^{35}$=H, D, CN, alkyl, fluoroalkyl, fluoroalkoxy, silyl, or aryl; and
R$^{36}$=H, D, F, CN, alkyl, silyl, alkoxy, fluoroalkoxy, or aryl; and
R$^3$=H, D, CN, alkyl, fluoroalkyl, fluoroalkoxy or silyl.

In some embodiments, Y is selected from the group consisting of Y-1, Y-2 and Y-3

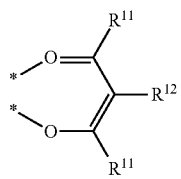

Y-1

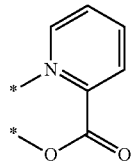

Y-2

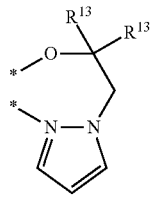

Y-3 wherein:
R$^{11}$ is the same or different at each occurrence and is selected from the group consisting of alkyl and fluoroalkyl;
R$^{12}$ is H, D, or F; and
R$^{13}$ is the same or different at each occurrence and is selected from the group consisting of alkyl and fluoroalkyl.

In some embodiments of the formulae, the alkyl, fluoroalkyl, alkoxy and fluoroalkoxy groups have 1-5 carbon atoms. In some embodiments, the alkyl group is methyl. In some embodiments, the fluoroalkyl group is trifluoromethyl. In some embodiments, the aryl group is a heteroaryl. In some embodiments, the aryl group is N-carbazolyl or N-carbazolylphenyl. In some embodiments, the aryl group is phenyl, substituted phenyl, biphenyl, or substituted biphenyl. In some embodiments, the aryl group is selected from the group consisting of phenyl, biphenyl, p-(C$_{1-5}$)alkylphenyl, and p-cyanophenyl.

In some embodiments, L=L-19 and the complex has the formula $IrL_3$. In some embodiments, L=L-20 and the complex has the formula $IrL_2Y$ or $IrL_3$. In some embodiments, L=L-21 and the complex has the formula $IrL_2Y$. In some embodiments, Y=Y-1. In some embodiments of Y-1, $R^{11}$ is selected from methyl and butyl and $R^{12}$ is H.

In some embodiments, L=L-18. In some embodiments of L-18, all the R=H or D.

In some embodiments, L=L-19. In some embodiments of L-19, $R^{28}$, $R^{29}$, $R^{30}$, $R^{31}$, $R^{32}$, and $R^{33}$ are H or D. In some embodiments of L-19, at least one of $R^{34}$, $R^{35}$, and $R^{36}$ is selected from the group consisting of methyl, methoxy, and t-butyl. In some embodiments of L-19, at least one of $R^{30}$ through $R^{33}$ is alkoxy. In some embodiments of L-19, at least one of $R^{34}$ through $R^{37}$ is alkoxy or fluoroalkoxy.

In some embodiments, L=L-20. In some embodiments of L-20, $R^{28}$, $R^{29}$, $R^{30}$, $R^{31}$, $R^{32}$ and $R^{33}$ are H or D. In some embodiments of L-20, $R^{36}$ is aryl. In some embodiments of L-20, at least one of $R^{28}$ and $R^{36}$ is a $C_{1-5}$ alkyl group.

In some embodiments, L=L-21. In some embodiments of L-21, $R^{30}$ through $R^{33}$ are H or D. In some embodiments of L-21, at least one of $R^{28}$ and $R^{36}$ is a $C_{1-5}$ alkyl group. In some embodiments of L-21, at least one of $R^{34}$ through $R^{37}$ is a $C_{1-5}$ alkoxy or fluoroalkoxy group.

Examples of ligand L-19 include, but are not limited to, those given in Tables 1 and 2 below. Examples of ligand L-20 include, but are not limited to, those given in Table 3 below.

TABLE 1

Ligand L-19.

| Ligand | $R^{35}$ | $R^{36}$ |
|---|---|---|
| R-1 | H | H |
| R-2 | H | CN |
| R-3 | CN | H |
| R-4 | H | 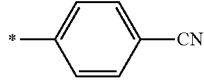 |
| R-5 |  | H |
| R-6 | H | 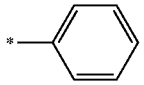 |
| R-7 | 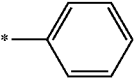 | H |
| R-8 | H | 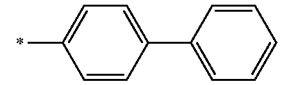 |
| R-9 | 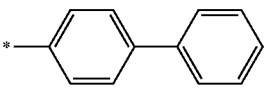 | H |
| R-10 | H | 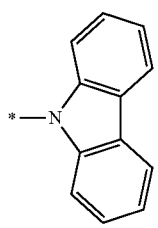 |
| R-11 | 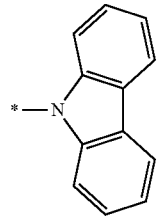 | H |

TABLE 1-continued

| | Ligand L-19. | |
|---|---|---|
| Ligand | $R^{35}$ | $R^{36}$ |
| R-12 | H | 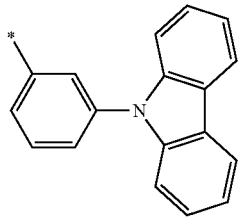 |
| R-13 | 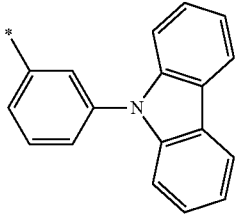 | H |
| R-14 | H | 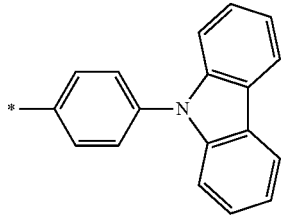 |
| R-15 | 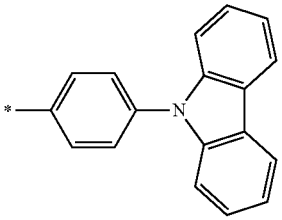 | H |
| R-16 | H | t-butyl |
| R-17 | $CH_3$ | F |
| R-18 | H | $OCH_3$ |
| R-19 | H | $OCHF_2$ | where $R^{28}$ through $R^{34}$, and $R^{37}$ are H

TABLE 2

| | Ligand L-19 | | | | | | |
|---|---|---|---|---|---|---|---|
| Ligand | $R^{30}$ | $R^{31}$ | $R^{32}$ | $R^{33}$ | $R^{34}$ | $R^{35}$ | $R^{36}$ |
| R-20 | H | H | H | H | H | H | t-Bu |
| R-21 | Me | H | H | H | H | H | H |
| R-22 | H | Me | H | H | H | H | H |
| R-23 | H | H | Me | H | H | H | H |
| R-24 | H | H | H | Me | H | H | H |
| R-25 | Me | H | H | H | H | t-Bu | H |
| R-26 | H | Me | H | H | H | t-Bu | H |
| R-27 | H | H | Me | H | H | t-Bu | H |
| R-28 | H | H | H | Me | H | t-Bu | H |
| R-29 | Me | H | H | H | H | H | t-Bu |
| R-30 | H | Me | H | H | H | H | t-Bu |
| R-31 | H | H | Me | H | H | H | t-Bu |
| R-32 | H | H | H | Me | H | H | t-Bu |
| R-33 | H | Me | Me | H | H | H | t-Bu |
| R-34 | H | Me | Me | H | H | H | H |
| R-35 | Me | Me | H | H | H | H | H |
| R-36 | Me | H | Me | H | H | H | H |
| R-37 | OMe | H | H | H | H | H | H |
| R-38 | H | OMe | H | H | H | H | H |
| R-39 | H | H | OMe | H | H | H | H |
| R-40 | OMe | H | H | H | H | t-Bu | H |
| R-41 | OMe | Me | H | H | H | H | H |
| R-42 | $SiMe_3$ | H | H | H | H | H | H |
| R-43 | H | $SiMe_3$ | H | H | H | H | H |
| R-44 | H | H | $SiMe_3$ | H | H | H | H |
| R-45 |  | H | H | H | H | H | H |
| R-46 | H | H | Me | H | H | H | OMe |
| R-47 | H | H | Me | H | OMe | H | OMe |

TABLE 2-continued

Ligand L-19

| Ligand | $R^{30}$ | $R^{31}$ | $R^{32}$ | $R^{33}$ | $R^{34}$ | $R^{35}$ | $R^{36}$ |
|---|---|---|---|---|---|---|---|
| R-48 | H | H | Me | H | H | H | OMe |
| R-49 | H | Me | Me | H | H | H | OMe |
| R-50 | H | H | Me | H | H | H | t-Bu |
| R-51 | H | OMe | H | H | H | H | t-Bu | where Me = methyl, t-Bu = t-butyl, and $R^{37}$ = H

TABLE 3

Ligand L-20

| Ligand | $R^{28}$ | $R^{34}$ | $R^{35}$ | $R^{36}$ |
|---|---|---|---|---|
| R-52 | H | H | H | t-Bu |
| R-53 | H | H | H | phenyl |
| R-54 | Me | H | H | t-Bu |
| R-55 | Me | H | H | phenyl |
| R-56 | Me | H | H | biphenyl |
| R-57 | Me | H | Me | phenyl | where Me = methyl, t-Bu = t-butyl, $R^{29}$-$R^{33}$ and $R^{37}$ = H

Examples of organometallic Ir complexes having red/red-orange emission color include, but are not limited to:

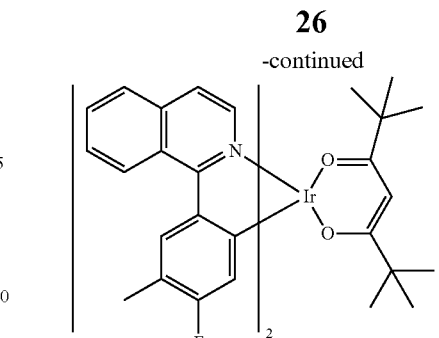

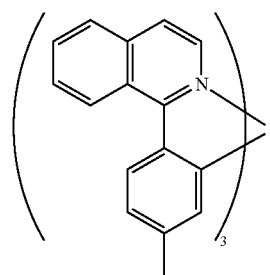

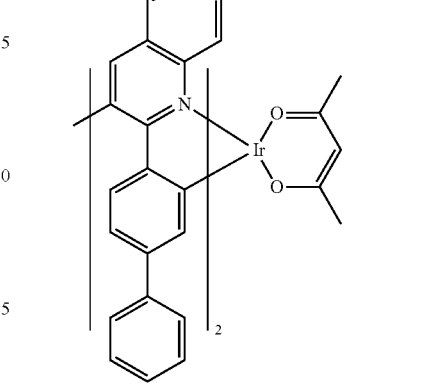

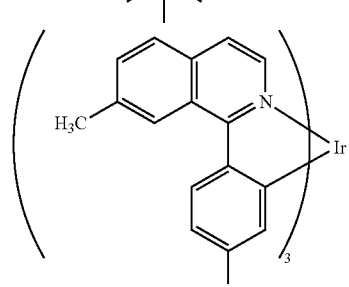

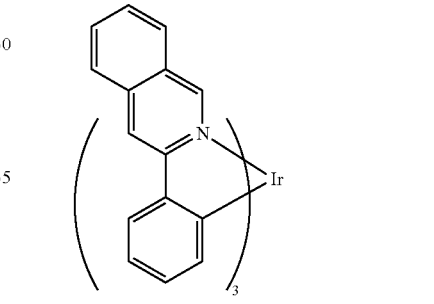

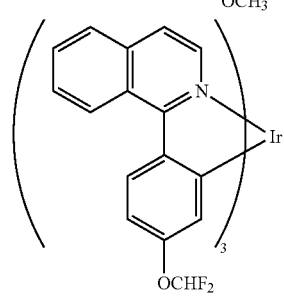

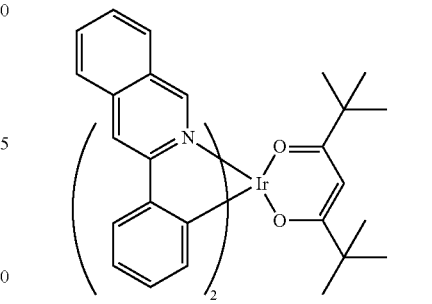

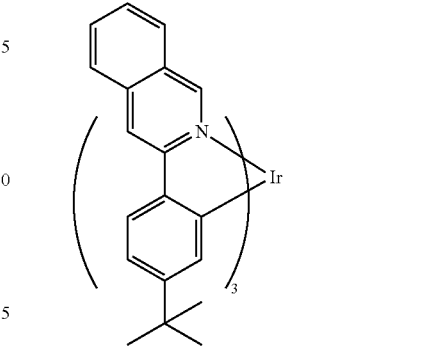

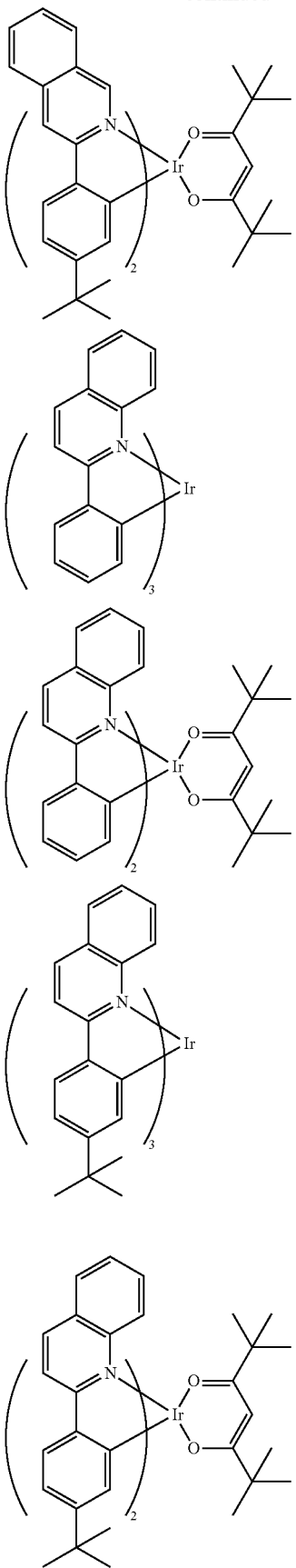

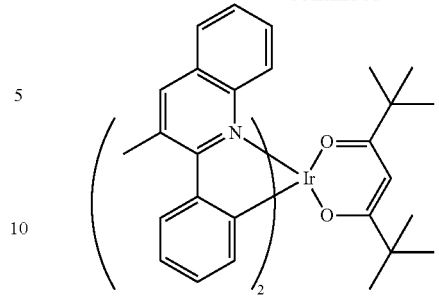

In some embodiments, the weight ratio of host:dopant is in the range of 10:1 to 1000:1; in some embodiments, 10:1 to 100:1. In some embodiments, dopant is present in less than 5 wt. %, based on the total weight of the electroluminescent layer; in some embodiment, less than 1 wt. %; in some embodiments, less than 0.1 wt %.

b. Other Layers

The materials to be used for the other layers of the luminaire described herein can be any of those known to be useful in OLED devices.

The anode is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode may also comprise an organic material such as polyaniline as described in "Flexible light-emitting diodes made from soluble conducting polymer," Nature vol. 357, pp 477 479 (11 Jun. 1992). At least one of the anode and cathode should be at least partially transparent to allow the generated light to be observed.

The hole injection layer comprises hole injection materials. Hole injection materials may be polymers, oligomers, or small molecules, and may be in the form of solutions, dispersions, suspensions, emulsions, colloidal mixtures, or other compositions.

The hole injection layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The hole injection layer can comprise charge transfer compounds, and the like, such as copper phthalocyanine and the tetrathiafulvalene-tetracyanoquinodimethane system (TTF-TCNQ). In one embodiment, the hole injection layer is made from a dispersion of a conducting polymer and a colloid-forming polymeric acid. Such materials have been described in, for example, published U.S. patent applications 2004-0102577, 2004-0127637, and 2005-0205860, and published PCT application WO 2009/018009.

The hole transport layer comprises hole transport material. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting small molecules and polymers can be used. Commonly used hole transporting molecules include, but are not limited to: 4,4',4''-tris(N,N-diphenyl-amino)-triphenylamine (TDATA); 4,4',4''-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 4,4'-bis(carbazol-9-yl)biphenyl (CBP); 1,3-bis(carbazol-9-yl)benzene (mCP); 1,1-bis[(di-4-tolylamino) phenyl]cyclohexane (TAPC); N,N'-bis(4-methylphenyl)-N,N'-bis(4-ethylphenyl)-[1,1'-(3, 3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl] (4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis (naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. Examples of crosslinkable hole transport polymers can be found in, for example, published US patent application 2005-0184287 and published PCT application WO 2005/052027. In some embodiments, the hole transport layer is doped with a p-dopant, such as tetrafluorotetracyanoquinodimethane and perylene-3,4,9,10-tetracarboxylic-3,4,9,10-dianhydride.

The electron transport layer can function both to facilitate electron transport, and also serve as a buffer layer or confinement layer to prevent quenching of the exciton at layer interfaces. Preferably, this layer promotes electron mobility and reduces exciton quenching. Examples of electron transport materials which can be used in the optional electron transport layer, include metal chelated oxinoid compounds, including metal quinolate derivatives such as tris(8-hydroxyquinolato) aluminum (AlQ), bis(2-methyl-8-quinolinolato)(p-phenylphenolato) aluminum (BAlq), tetrakis-(8-hydroxyquinolato)hafnium (HfQ) and tetrakis-(8-hydroxyquinolato) zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof. In some embodiments, the electron transport layer further comprises an n-dopant. N-dopant materials are well known. The n-dopants include, but are not limited to, Group 1 and 2 metals; Group 1 and 2 metal salts, such as LiF, CsF, and $Cs_2CO_3$; Group 1 and 2 metal organic compounds, such as Li quinolate; and molecular n-dopants, such as leuco dyes, metal complexes, such as $W_2(hpp)_4$ where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

The cathode, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing organometallic compounds, LiF, $Li_2O$, Cs-containing organometallic compounds, CsF, $Cs_2O$, and $Cs_2CO_3$ can also be deposited between the organic layer and the cathode layer to lower the operating voltage. This layer may be referred to as an electron injection layer.

The choice of materials for each of the component layers is preferably determined by balancing the positive and negative charges in the emitter layer to provide a device with high electroluminescence efficiency.

In one embodiment, the different layers have the following range of thicknesses: anode, 500-5000 Å, in one embodiment 1000-2000 Å; hole injection layer, 50-2000 Å, in one embodiment 200-1000 Å; hole transport layer, 50-2000 Å, in one embodiment 200-1000 Å; photoactive layer, 10-2000 Å, in one embodiment 100-1000 Å; electron transport layer, 50-2000 Å, in one embodiment 100-1000 Å; cathode, 200-10000 Å, in one embodiment 300-5000 Å. The desired ratio of layer thicknesses will depend on the exact nature of the materials used.

The OLED luminaire may also include outcoupling enhancements to increase outcoupling efficiency and prevent waveguiding on the side of the device. Types of light outcoupling enhancements include surface films on the viewing side which include ordered structures like e.g. micro spheres or lenses. Another approach is the use of random structures to achieve light scattering like sanding of the surface and or the application of an aerogel.

The OLED luminaries described herein can have several advantages over incumbent lighting materials. The OLED luminaries have the potential for lower power consumption than incandescent bulbs. Efficiencies of greater than 50 lm/W may be achieved. The OLED luminaries can have Improved light quality vs. fluorescent. The color rendering can be greater than 80, vs that of 62 for fluorescent bulbs. The diffuse nature of the OLED reduces the need for an external diffuser unlike all other lighting options.

In addition, the OLED luminaries described herein have advantages over other white light-emitting devices. The structure is much simpler than devices with stacked electroluminescent layers. It is easier to tune the color. There is higher material utilization than with devices formed by evaporation of electroluminescent materials. It is possible to use any type of electroluminescent material, as well as electroluminescent polymers.

4. Process

The process for making an OLED luminaire, comprises:
providing a substrate having a first electrode thereon;
depositing a liquid composition comprising a liquid medium having dispersed therein a host material capable of electroluminescence having an emission color that is blue-green and an electroluminescent dopant having an emission color that is red/red-orange;
drying the deposited composition to form an electroluminescent layer; and
forming a second electrode overall.

Any known liquid deposition technique can be used, including continuous and discontinuous techniques. In some embodiments, the liquid composition comprising electroluminescent material is deposited by continuous liquid deposition. Examples of continuous liquid deposition techniques include, but are not limited to spin coating, gravure coating, curtain coating, dip coating, slot-die coating, spray coating, and continuous nozzle coating.

Any conventional drying technique can be used, including heating, vacuum, and combinations thereof. In some embodiments, the drying steps together result in a layer that is essentially completely dried. Further drying of the essentially completely dried layer does not result in any further device performance changes.

In some embodiments, the drying step is a multi-stage process. In some embodiments, the drying step has a first stage in which the deposited composition is partially dried and a second stage in which the partially dried composition is essentially completely dried.

In some embodiments, the process uses as a substrate a glass substrate coated with ITO. Slot-die coating can be used to coat a hole injection layer from aqueous solution, followed by a second pass through a slot-die coater for a hole transport layer. The electroluminescent layer can also be deposited by slot-die coating. The slot-die process steps can be carried out in a standard clean-room atmosphere. Next the device is transported to a vacuum chamber for the deposition of the electron transport layer and the metallic cathode. This is the only step that requires vacuum chamber equipment. Finally the whole luminaire is hermetically sealed using encapsulation technology, as described above.

Note that not all of the activities described above in the general description are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. An organic light-emitting diode luminaire comprising a first electrode, a second electrode, and an electroluminescent layer therebetween, the electroluminescent layer consisting essentially of:
   a host material capable of electroluminescence having an emission color that is blue green, wherein the host with blue-green emission color is a chrysene derivative having Formula II:

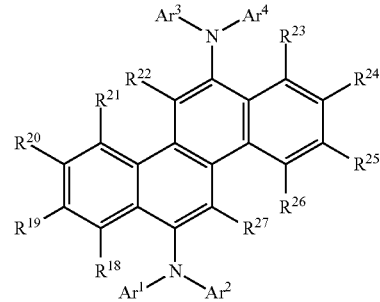

Formula II wherein:
   $Ar^1$ and $Ar^3$ are the same or different and are aryl, and at least one of $Ar^1$ and $Ar^3$ has at least one alky substituent, with the proviso that there are no electron-withdrawing substituents;

$Ar^2$ and $Ar^4$ are the same or different and are aryl;

$R^{18}$, $R^{19}$, and $R^{21}$ are the same or different and are selected from the group consisting of H, D, and an electron-withdrawing group;

$R^{20}$ is an electron-withdrawing group;

$R^{22}$ through $R^{27}$ are the same or different and are selected from the group consisting of H, D, and alky and an electroluminescent dopant having an emission color that is red/red-orange; wherein the additive mixing of the two emitted colors results in an overall emission of white light.

2. The luminaire of claim 1, wherein the electroluminescent dopant is a tris-cyclometallated complex having the formula $IrL_3$ or a bis-cyclometallated complex having the formula $IrL_2Y$, where Y is a monoanionic bidentate ligand and L has a formula selected from the group consisting of Formula L-18, L-19, L-20 and L-21:

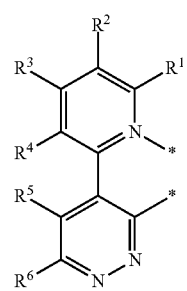

L-18

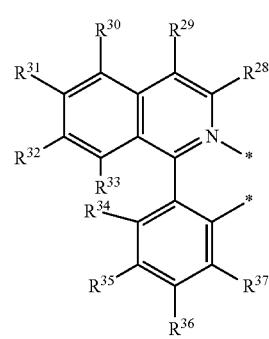

L-19

-continued

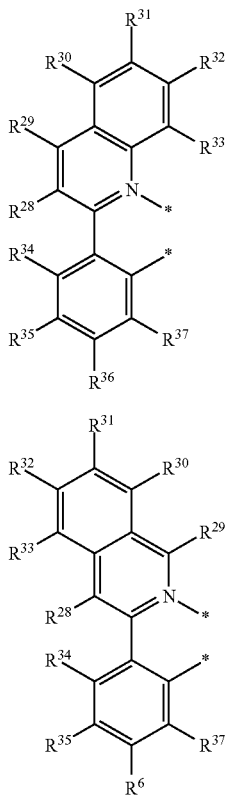

where:
R$^1$ through R$^6$ and R$^{28}$ through R$^{37}$ are the same or different and are selected from the group consisting of H, D, electron-donating groups, and electron-withdrawing groups; and

* represents a point of coordination with Ir.

3. The luminaire of claim 2, wherein:
R$^1$ through R$^4$ and R$^{28}$ through R$^{33}$ are the same or different and are H, D, alkyl, alkoxy, or silyl; where in ligand L-19 any one or more of (i) R$^1$ and R$^2$, (ii) R$^2$ and R$^3$, and (iii) R$^3$ and R$^4$ can be joined together to form a hydrocarbon ring or hetero ring; in ligand L-19 any one or more of (iv) R$^{30}$ and R$^{31}$ and (v) R$^{31}$ and R$^{32}$ can be joined together to form a hydrocarbon ring or hetero ring; in ligand L-20 any one or more of (vi) R$^{30}$ and R$^{31}$ and (vii) R$^{31}$ and R$^{32}$ can be joined together to form a hydrocarbon ring or hetero ring; in ligand L-21 any one or more of (viii) R$^{31}$ and R$^{31}$, (ix) R$^{31}$ and R$^{32}$, and (x) R$^{32}$ and R$^{33}$ can be joined together to form a hydrocarbon ring or hetero ring;

R$^{34}$=H, D, F, alkyl, silyl, or alkoxy;
R$^{35}$=H, D, CN, alkyl, fluoroalkyl, fluoroalkoxy, silyl, or aryl; and
R$^{36}$=H, D, F, CN, alkyl, silyl, alkoxy, fluoroalkoxy, or aryl; and
R$^{37}$=H, D, CN, alkyl, fluoroalkyl, fluoroalkoxy or silyl.

4. The luminaire of claim 2, wherein Y is selected

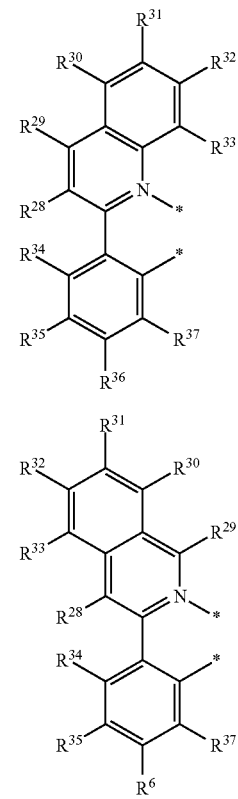

from the group consisting of Y-1, Y-2 and Y-3
wherein:
R$^{11}$ is the same or different at each occurrence and is selected from the group consisting of alkyl and fluoroalkyl;
R$^{12}$ is H, D, or F; and
R$^{13}$ is the same or different at each occurrence and is selected from the group consisting of alkyl and fluoroalkyl.

5. The luminaire of claim 1, wherein the weight ratio of host:dopant is in the range of 10:1 to 100:1.

* * * * *